United States Patent [19]
Bair et al.

[11] Patent Number: 5,577,050
[45] Date of Patent: Nov. 19, 1996

[54] METHOD AND APPARATUS FOR CONFIGURABLE BUILD-IN SELF-REPAIRING OF ASIC MEMORIES DESIGN

[75] Inventors: Owen S. Bair, Saratoga; Adam Kablanian; Charles Li, both of San Jose; Farzad Zarrinfar, Pleasanton, all of Calif.

[73] Assignee: LSI Logic Corporation, Milpitas, Calif.

[21] Appl. No.: 365,286

[22] Filed: Dec. 28, 1994

[51] Int. Cl.⁶ .................................................. G01R 31/28
[52] U.S. Cl. .......................................... 371/10.2; 365/201
[58] Field of Search ................................. 371/10.1, 10.2, 371/10.3, 11.1; 365/200, 201

[56] References Cited

U.S. PATENT DOCUMENTS

| | | | |
|---|---|---|---|
| 4,757,503 | 7/1988 | Hayes et al. | 371/21 |
| 5,153,880 | 10/1992 | Owen et al. | 371/10.3 |
| 5,377,146 | 12/1994 | Reddy et al. | 365/200 |

Primary Examiner—Vincent P. Canney
Attorney, Agent, or Firm—Fenwick & West

[57] ABSTRACT

A logic circuit and a technique for repairing faulty memory cells internally by employing on-chip testing and repairing circuits in an ASIC system. The test circuit detects column line faults, row faults, and data retention faults in a memory array. The repair circuit redirects the original address locations of the faulty memory lines to the mapped address locations of the redundant column or row lines. This repair scheme includes redundant column lines attached to each of the I/O arrays in the memory array and redundant row lines to replace detected memory faults. These testing and repairing procedures are performed within the chip without the aid of any external equipment.

17 Claims, 8 Drawing Sheets

| ADDRESS | INITIAL MARCH | MARCH ELEMENT 1 | MARCH ELEMENT 2 | MARCH ELEMENT 3T | MARCH ELEMENT 4 | WAIT | MARCH ELEMENT 5 | WAIT | FINAL MARCH |
|---|---|---|---|---|---|---|---|---|---|
| 0 | WR(0) | RD(0).WR(1) | RD(1).WR(0) | RD(0).WR(1) | RD(1).WR(0) | | RD(1).WR(0) | | RD(1) |
| 1 | WR(0) | RD(0).WR(1) | RD(1).WR(0) | RD(0).WR(1) | RD(1).WR(0) | | RD(1).WR(0) | | RD(1) |
| 2 | WR(0) | RD(0).WR(1) | RD(1).WR(0) | RD(0).WR(1) | RD(1).WR(0) | | RD(1).WR(0) | | RD(1) |
| | | | | | | DISABLE RAM FOR RETENTION | | DISABLE RAM FOR RETENTION | |
| N-1 | WR(0) | RD(0).WR(1) | RD(1).WR(0) | RD(0).WR(1) | RD(1).WR(0) | | RD(1).WR(0) | | RD(1) |

*FIG. 7a*

| ADDRESS | INITIAL MARCH | MARCH ELEMENT 1 | MARCH ELEMENT 2 | MARCH ELEMENT 3T | MARCH ELEMENT 4 | WAIT | MARCH ELEMENT 5 | WAIT | FINAL MARCH |
|---|---|---|---|---|---|---|---|---|---|
| 0 | WR(0) | RD(0).WR(1) | RD(1).WR(0) | RD(0).WR(1) | RD(1).WR(0) | | RD(1).WR(0) | | RD(1) |
| 1 | WR(0) | RD(0).WR(1) | RD(1).WR(0) | RD(0).WR(1) | RD(1).WR(0) | DISABLE RAM FOR RETENTION | RD(1).WR(0) | | RD(1) |
| 2 | WR(0) | RD(0).WR(1) | RD(1).WR(0) | RD(0).WR(1) | RD(1).WR(0) | | RD(1).WR(0) | DISABLE RAM FOR RETENTION | RD(1) |
| ... | | | | | | | | | |
| N-1 | WR(0) | RD(0).WR(1) | RD(1).WR(0) | RD(0).WR(1) | RD(1).WR(0) | | RD(1).WR(0) | | RD(1) |

*FIG. 7b*

METHOD AND APPARATUS FOR CONFIGURABLE BUILD-IN SELF-REPAIRING OF ASIC MEMORIES DESIGN

BACKGROUND OF THE INVENTION

1. Technical Field of the Invention

The present invention relates generally to application specific integrated circuit (ASIC) memories and more specifically to a method and an apparatus for repairing memory faults within an ASIC chip.

2. Description of the Background Art

It is common practice for the manufacturers of ASIC chips to test the functionality of the ASIC memories at the manufacturing site. After the chips have been tested and certified for shipment upon sale to the users, the users generally depend upon the reliability of the chips for their own system design to function properly. As the density and line width of memory cells within a memory array circuit chip continue to shrink (now at less than one-half micron), this reliability becomes more difficult to attain. The challenges for manufacturers of ASIC chips is to increase memory capacity without decreasing the chip yields.

Before the ASIC chips are released for shipment, they typically undergo testing to verify that each of the memory cells within the memory array is functioning properly. This testing method is routinely done because it is not uncommon for a large percentage of the memory cells within the ASIC chips to fail, including manufacturing defects and degradation faults.

In the past, ASIC memories have been tested using an external memory tester or Automatic Test Equipment (ATE)) at the manufacturing site. This testing technique is not available to users once the chips have been shipped, making it difficult to detect faulty memory cells at the user site. Even if test equipment is available to users, field repairs are expensive, time consuming, and impractical.

In addition, some repairs of ASIC memories have also been performed at the manufacturing site. Conventional repairing techniques bypass the defective cells by hardwiring through fuzable links using laser techniques that cause address redirection. However, these techniques are limited to one-time repair and require significant capital investment for implementing the technical complexity of the repairing process because the test patterns must pass through several layers of mask logic.

In sum, ASIC memories have been tested and repaired at the manufacturer site using fuse/antifuse techniques to detect the location of defects and to perform repairs as part of the manufacturing process. These techniques are costly and leave the semiconductor chips useless if the memories become defective after shipment from the manufacturing site.

Hence, there is a need to provide on-chip test and repair techniques to fix faulty ASIC memories.

SUMMARY OF THE INVENTION

In accordance with the present invention, an ASIC chip includes on-chip build-in self-repairing (BISR) circuitry for repairing faulty memory cells without having to rely upon external testing and repairing equipment. The invention repairs faulty memory cells internally by: (a) generating test patterns to detect stuck-at, stuck-open, and bridging faults during the column test, and to detect memory cell faults and retention faults during the row test; (b) providing row and column redundancy to be used in replacing the faulty memory locations; and (c) repairing the faulty memory cells by redirecting the original address locations of faulty memory lines detected to the mapped address locations of the redundant columns and rows.

DETAIL DESCRIPTION OF THE PREFERRED EMBODIMENT

Figure 1:
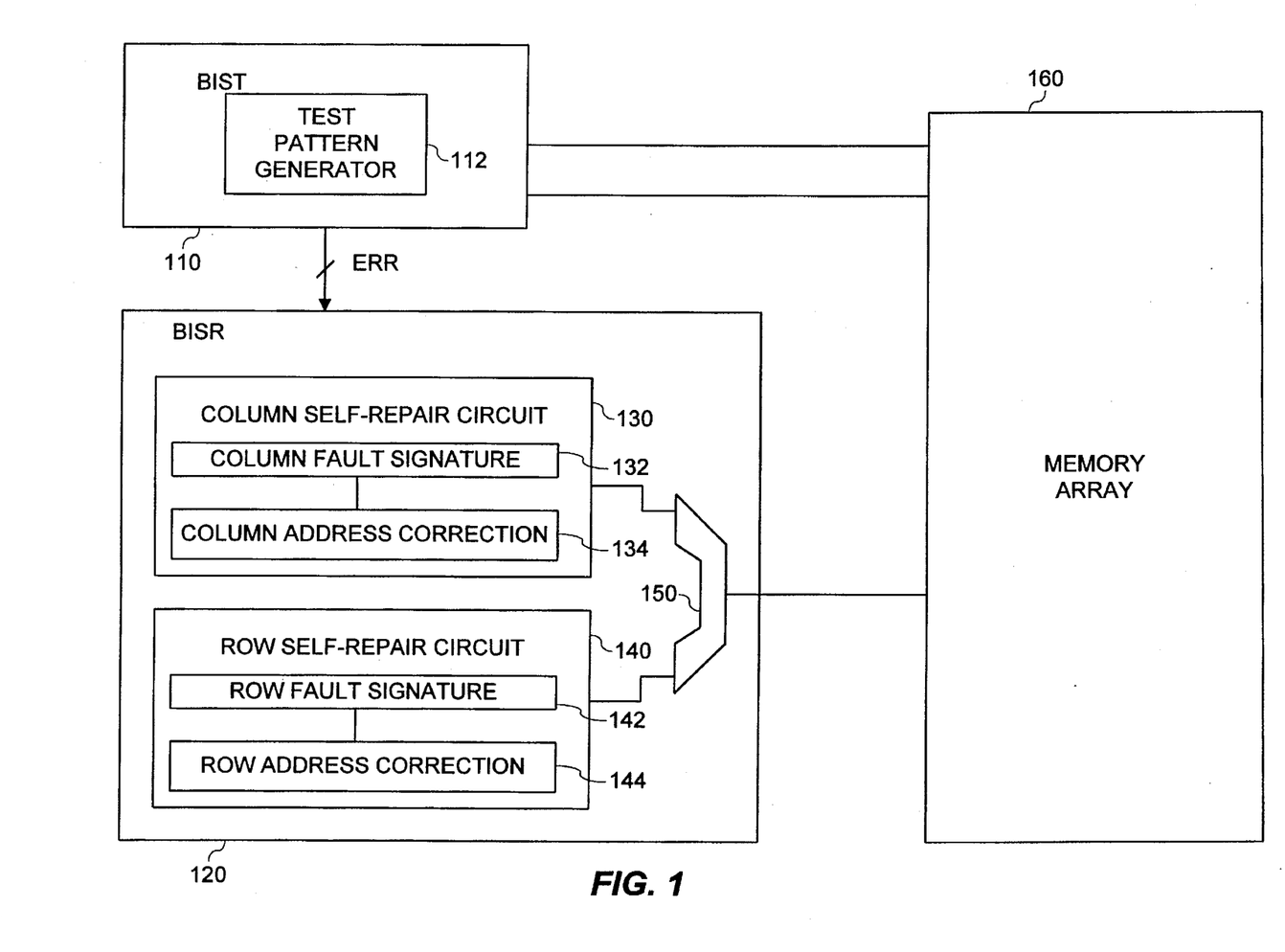
FIG. 1 shows a block diagram of one embodiment of an ASIC system for the present invention.

Referring now to FIG. 1, there is shown a block diagram of the present system for testing and repairing configurable ASIC memories. The system comprises a build-in self-test (BIST) circuit 110, a build-in self-repair (BISR) 120 circuit, and a memory array 160. BIST 110 is connected to memory array 160 to transfer test patterns to detect column and row faults in memory array 160. BISR 120 is connected to memory array 160 to repair detected column and row faults by redirecting the original address locations of faulty memory lines to the mapped address locations of redundancy lines. The addresses of column and row faults are transferred from BIST 110 to BISR 120 to enable BISR 120 to repair the faulty memory lines.

BIST 110 includes a test pattern generator 112 to generate patterns for detecting three types of faults, including column line faults, row faults, and retention faults. Test pattern generator 112 produces a data pattern that provides optimal fault coverage in identifying the faulty memory cells. In this embodiment, memory faults are verified by performing two separate tests, namely the column lines test 520, and the row test 540 and the data retention test 550. BIST 110 is further connected via at least one ERR pin 242 to BISR 120 to transfer the results of the memory array test from the test circuitry to the repair circuitry.

BISR 120 contains a column self-repair circuit 130, row self-repair circuit 140, and a multiplexer 150. The column selfrepair circuit 130 includes a column fault signature block 132 and column address correction block 134, and similarly the row self-repair circuit 140 includes a row fault signature 142 and row address correction 144. Column fault signature 132 stores the original address locations of the faulty column memory lines and compares incoming addresses to the stored addresses. If the stored address matches the incoming address, then the fault signature block 132 informs the address correction block 134 to change the original address to the redundant address. Column address correction block 134 translates the original address locations of the faulty memory lines to the mapped address locations of the redundancy memory lines. In addition, column address correction block 134 maps the user address space onto the physical space of memory array 160. This address translation is accomplished by adding extra bits to an incoming address and correcting that original address to the address of the redundant row or column. Column address correction block 134 also selects between the test address and the normal operation address based on the test enable signals.

Similarly, row fault signature block 142 and row address correction block 144 are used to detect row faults. Row fault signature block 142 stores the original address locations of the faulty row memory cells. Row address correction block 144 translates the original address locations of the faulty row memory cells to the mapped address locations of the redundancy memory lines. Column fault signature 132 and address correction 134 become active during the row test so that any faulty column is mapped to the redundant column for the row test. This prevents a column fault from affecting the results of the row test, which would detect faults in multiple rows along the faulty column resulting in a fatal error.

Figure 2:
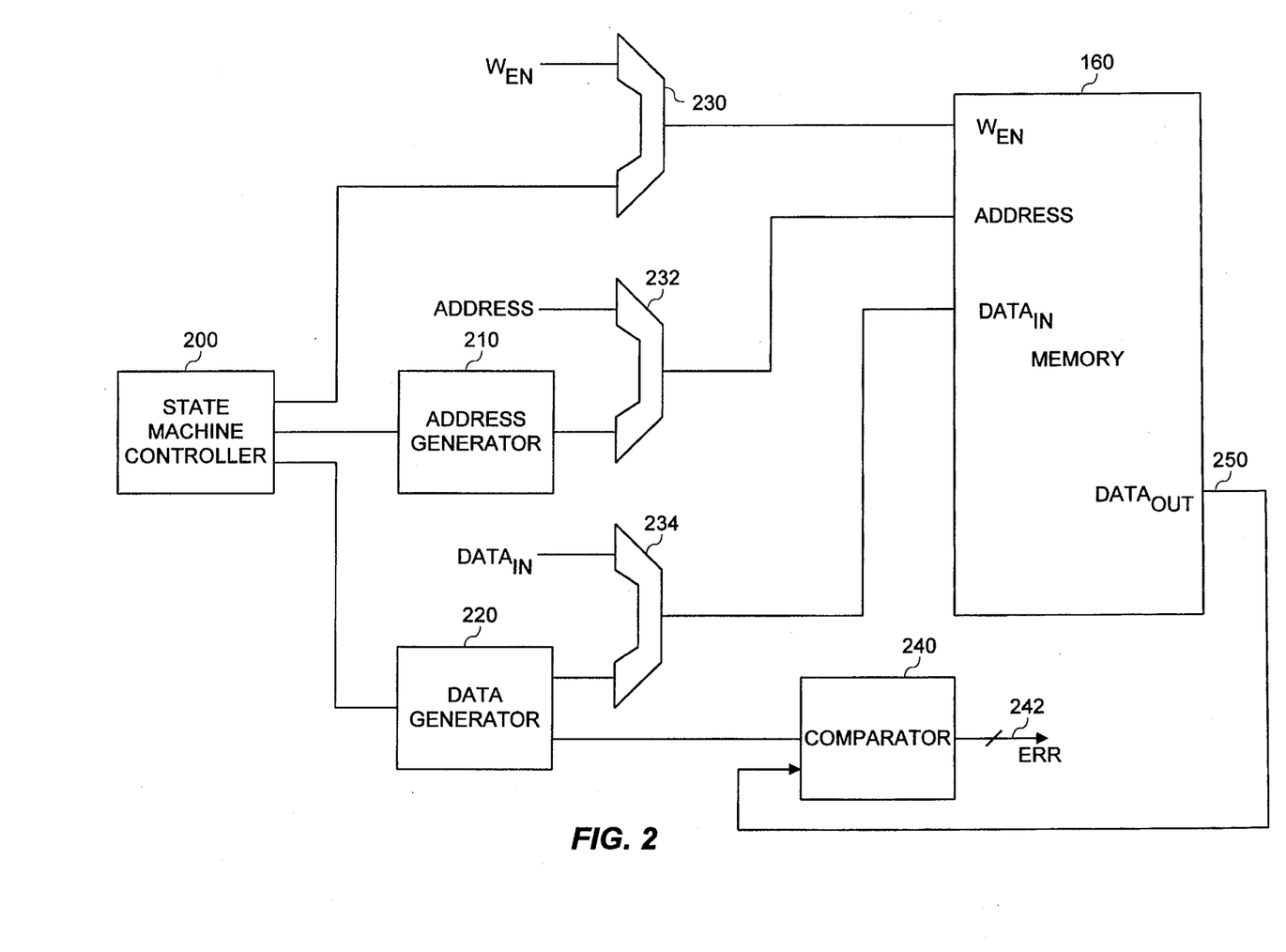
FIG. 2 shows a block diagram of the build-in self-test circuit.

Column and row fault signature blocks 132 and 134 respectively store the address location of a fault as it is detected by the comparator 240. Both the column and row fault signature blocks 132 and 134 latch-in the address of the first fault that is encountered in the column or row test. In the column faulty signature block 132, all subsequent errors are ignored since those errors will be detected by the row test. Row fault signature block 142 sets a fatal error signal if two errors at different row addresses are detected during the row testing procedure. Subsequent error signals during the row testing cause the fatal error signal to be set if the address is different from the faulty row address already stored. If the row addresses match, then that row gets redirected during the normal operation so the memory can be repaired. The fatal error signal informs the user that the chip is not repairable and should be replaced.

Column and row address correction blocks 134 and 144 respectively translate between the user address space and the physical address space of the memory. An incoming address which matches a faulty address stored in the fault signature blocks 132 and 134 is redirected to the redundant address. Incoming addresses which are not faulty are passed through unchanged. If address redirection is necessary, the address correction blocks 134 and 144 add extra bits to the incoming address to concatenate a new address for the redundant row and column lines. The address correction blocks 134 and 144 also act as multiplexers between the test address and the normal incoming address depending on the row and column test enable signals. For fault redirection in normal operation, a signal is received from fault signature blocks 132 and 134 when the incoming address matches the stored faulty address, instructing the address correction block to change to the address of the redundant location. For example, if the incoming row address 00110110 (36 in hex) is faulty, then the row address correction block 144 would change the address to the redundant row address, which is 100000000 (100 in hex) and the column address bits remain unaffected.

Figure 3:
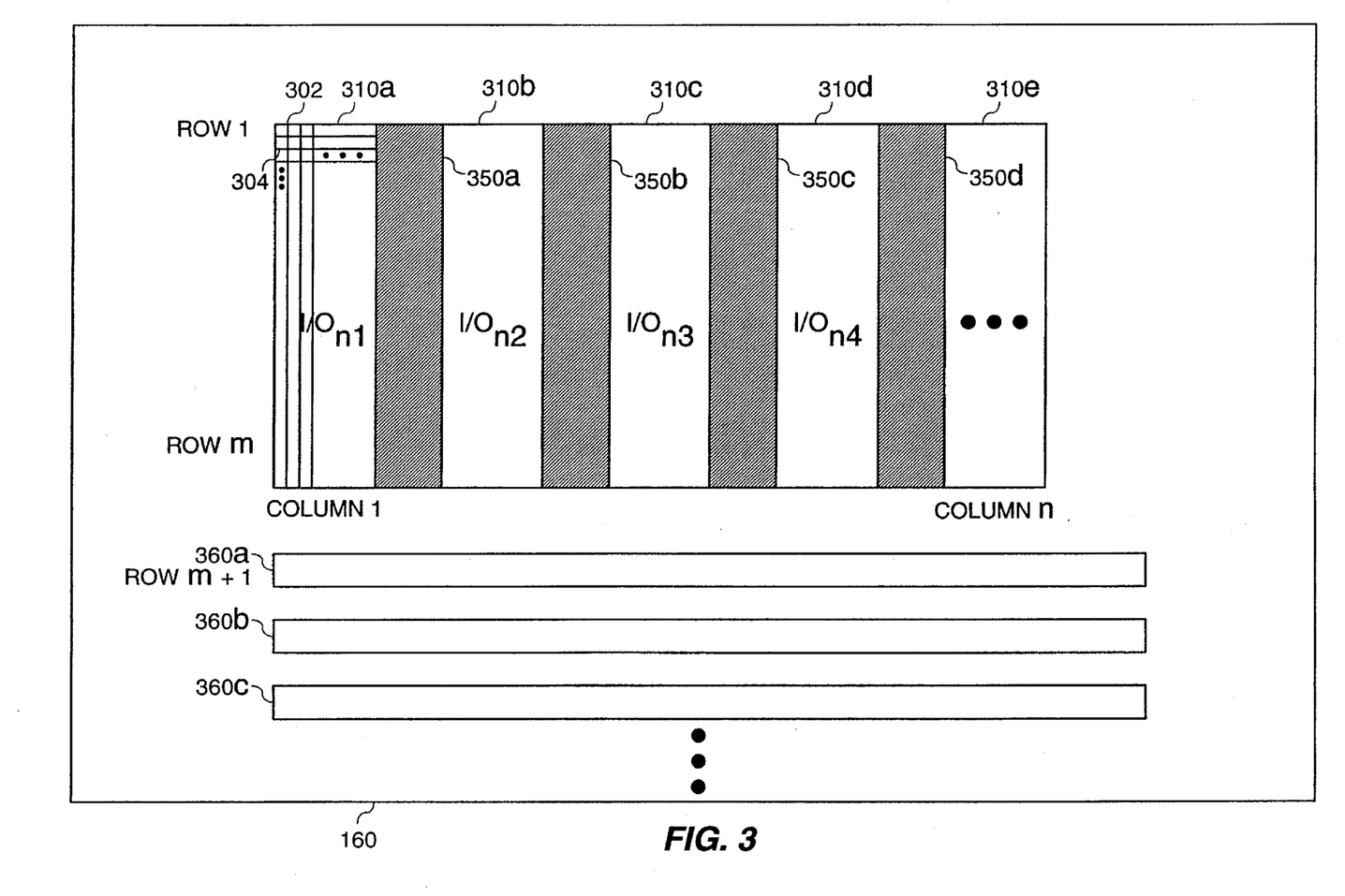
FIG. 3 shows a memory array architecture of an embodiment with redundancy column and row lines.

Further, BISR 120 contains a multiplexer 150, which selects either column self-repair sub-circuit 130 to redirect the faulty address locations to the redundancy column lines 305 or selects the row self-repair sub-circuit 140 to redirect the faulty address locations to the redundancy row lines 360.

Referring now to FIG. 2, there is shown a block diagram of one embodiment of BIST 110 in accordance with the present invention. BIST 110 comprises a state machine controller 200, an address generator 210, a data generator 220, a comparator 240, and multiplexers 230, 232, and 234. State machine controller 200 dictates the logical states for each pass function, namely address generator 210, data generator 220, and the write enable signal WEN, in the sequence as specified by the test pattern algorithm. The address generator 210 generates address sequence in an order as specified by the test pattern algorithm. Data generator 220 provides a set of data bits in a pattern maximizes fault coverage detected for stuck-at, stuck-open, and data retention faults. After the data bits have propagated through memory array 160, a Dataout signal 250 is fed back to the comparator 240, which compares Dataout signal 250 on the read cycle against the binary bits produced by data generator 220 on the write cycle. If there is no difference between an incoming address and Dataout signal 250, then an error signal is not generated. If the two signals differ in their data binary sequence, an ERR signal 242 is generated to indicate that a fault has been detected at that particular memory location. The output of comparator 240 transmits the ERR signal from BIST 110 to BISR 120.

FIG. 3 shows memory array 160 with column redundancy lines 350 and row redundancy lines 360 for repairing faults within memory array 160. In particular, inclusion of redundant column and row lines is necessary for repairing faulty memory lines internal to a chip. Memory array 160 comprises a series of input/output (I/O) arrays 310 where each I/O array 310 contains a matrix of column lines 302 intersecting with row lines 304. For example, if a memory array 160 stores 512 words with a word length of 32-bits each, the structure of memory array 160 contains 32 I/O arrays 310 with 512 memory cells per I/O array 310. Within each I/O array 310, the 512 memory cells are arranged as 64 rows by 8 columns. Each bit in a word is stored in a separate I/O array 310 with a single read and single write port. All of the I/O arrays 310 are identical in terms of the number of rows and columns, and all share common row and column decoders.

For each of I/O array 310, there is at least one column redundancy line 350 that couples to each of I/O arrays 310. Redundant lines in both rows 360 and columns 350 are included within memory array 160 to serve as replacement memory rows and memory columns for defective rows and columns. Thus, if a particular memory location of a chip fails to pass the test, a repair procedure can redirect the location of the data storage to the spare redundancy lines which replace faulty memory lines. In this illustrated embodiment, row redundancy lines 360 are oriented horizontally with respect to memory array 160 such that the plurality of the row redundancy lines 360 are arranged in consecutive order, comparing to column redundancy lines 306 which are attached to individual I/O arrays. The number of redundant columns 306 or the number of redundant rows 360 can be expanded according to the memory architecture. In one embodiment, when an error is detected in memory array 160, column redundancy lines 306 are first selected to replace the column faults detected in memory array 160. Once a first of column redundancy line 350a has been chosen to replace a specified column for a particular I/O array, the other column redundancy lines 350, such as 350b, 350c, and 350d, replace the same column line locations for the corresponding I/O arrays 310. Subsequently, redundant rows 360 are used to replace the outstanding faults detected in I/O array 308 within memory array 160.

The redirection of addresses steers data away from the original address locations of faulty memory cells to the translated addresses of redundant column 350 or row lines 360. Redundant column 350 and row lines 360 are associated with their own addresses, and redirection replaces the original address locations of the faulty memory lines with the mapped address locations of the redundant column and row lines. During normal operation, column fault signature block 132 and row fault signature block 142 store the address locations of the faulty memory lines, which are used to compare with the incoming addresses to determine if address redirections are necessary.

Figure 4:
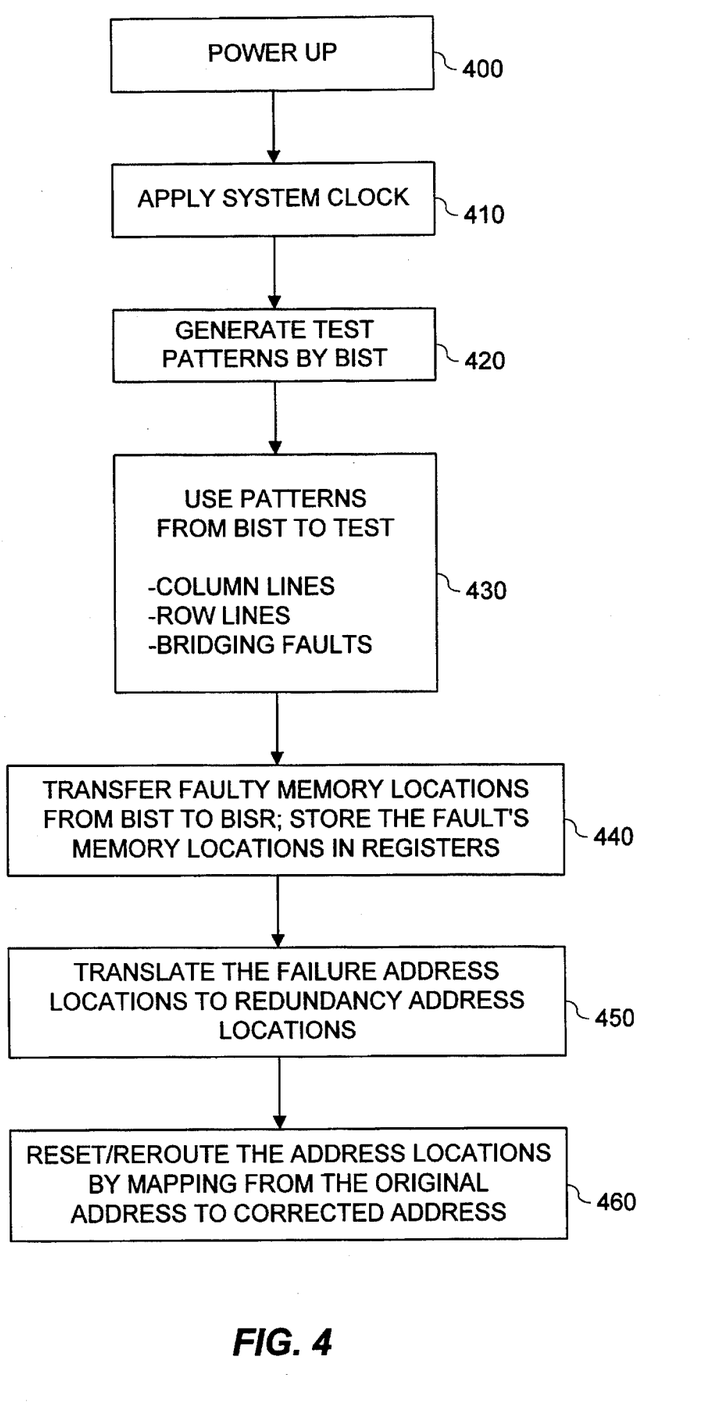
FIG. 4 shows a flow chart of the operation of the present system.

FIG. 4 shows a flow chart representing a method of testing and repairing the faulty column and row lines in accordance with the present invention. Diagnosis of the ASIC chip is performed every time power 400 is supplied to the system by triggering BIST 110 and BISR 120 circuits to test and repair the ASIC memories at each power-up. On power up, system clock 410 starts the internal repairing process. Test pattern generator 112 in BIST 110 generates test patterns 420 which are coupled to memory array 160 to detect various types of faults 430, including column, row and bridging faults. After BIST 110 detects the faulty memory lines from memory array 160, the original address locations of the faulty memory lines are transferred to BISR 120 and stored in register 440. The original address locations of the faulty memory lines are then translated to the mapped address locations of the redundancy lines 350 and 360. BISR 120 then redirects the original address locations to the mapped address locations 460.

Figure 5:
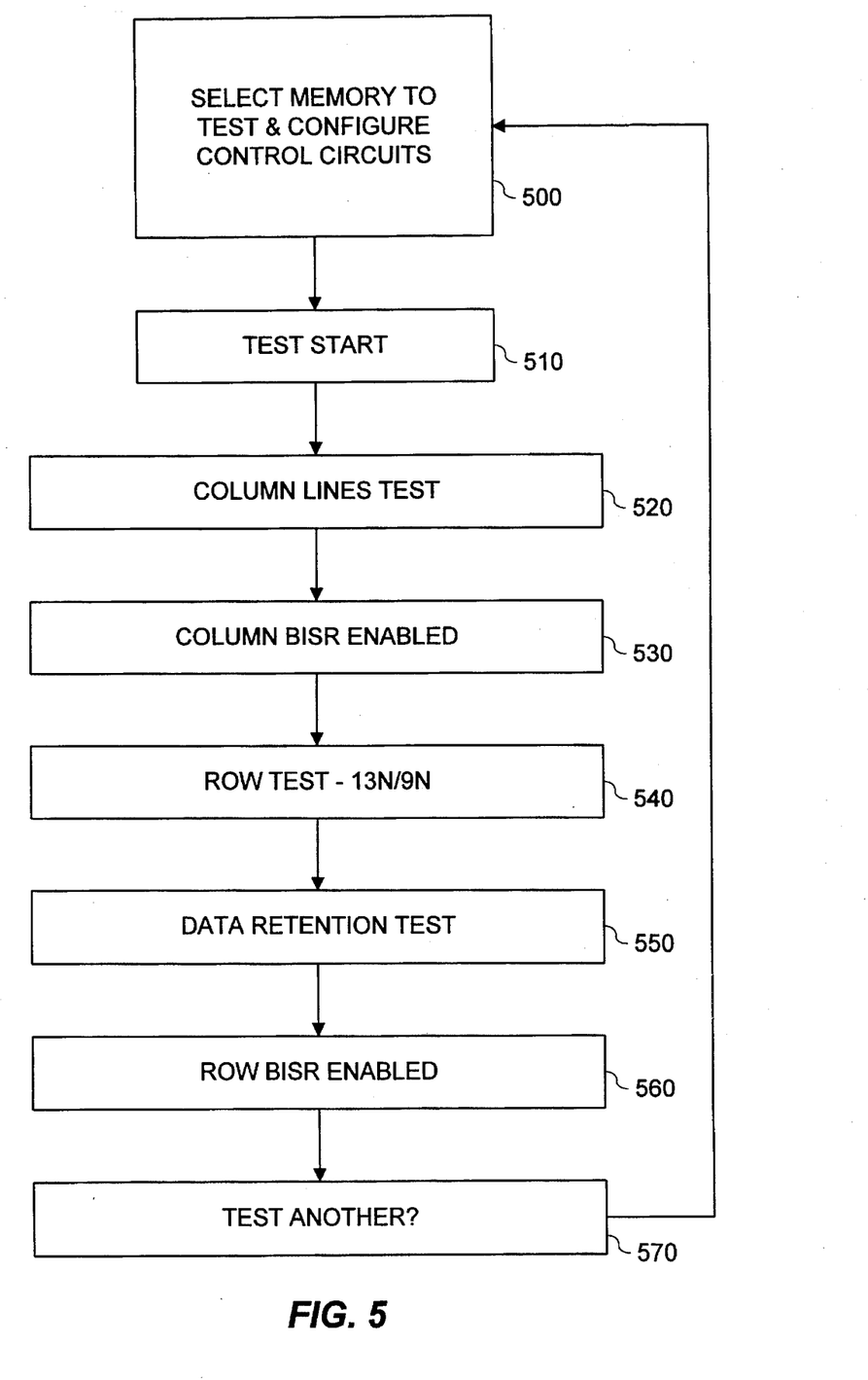
FIG. 5 shows a flow chart of the process in testing the memory array.

Referring now to FIG. 5, there is shown a method of testing and repairing procedures 500 in configuring a memory to be tested prior to initiating 510 tests. Column lines test and row test are performed separately where the row test is intended to detect faults within the memory cells and the column lines test detect faults surrounding the structure of the memory cells without actually accessing the memory cells. Faults can occur on the column lines or in the memory cells themselves. While row test ensures that the individual memory cell is storing the data accurately, the column lines test verifies that the structure of the memory cells is functioning properly by passing values along the column lines without actually accessing the content value of the memory cells. The column lines test 520 checks for faults on column lines, including stuck-at faults, stuck-open faults, and bridging faults. Column stuck-at/stuck-open and column bridging faults are detected using different methods, so the column test is divided into two phases. During the first phase, the test for stuck-at/stuck-open faults is performed first, followed by the test for bridging faults in the second phase. The column stuck-at/stuck-open test generates test patterns that check for both "0" to "1" and "1" to "0" toggles on the column lines. This is accomplished by passing the test pattern onto the lines at one end of the columns and compared at the opposite end. If the pattern received at the opposite end does not match the written pattern, then there exists a stuck-at or stuck-open fault on the column line. Comparison of the input and output of the columns is executed for each toggle after the test pattern had propagated through the columns. After the column faults in memory array 160 have been detected, column BISR 530 is enabled to repair the faulty lines in memory array 160.

Figure 6:
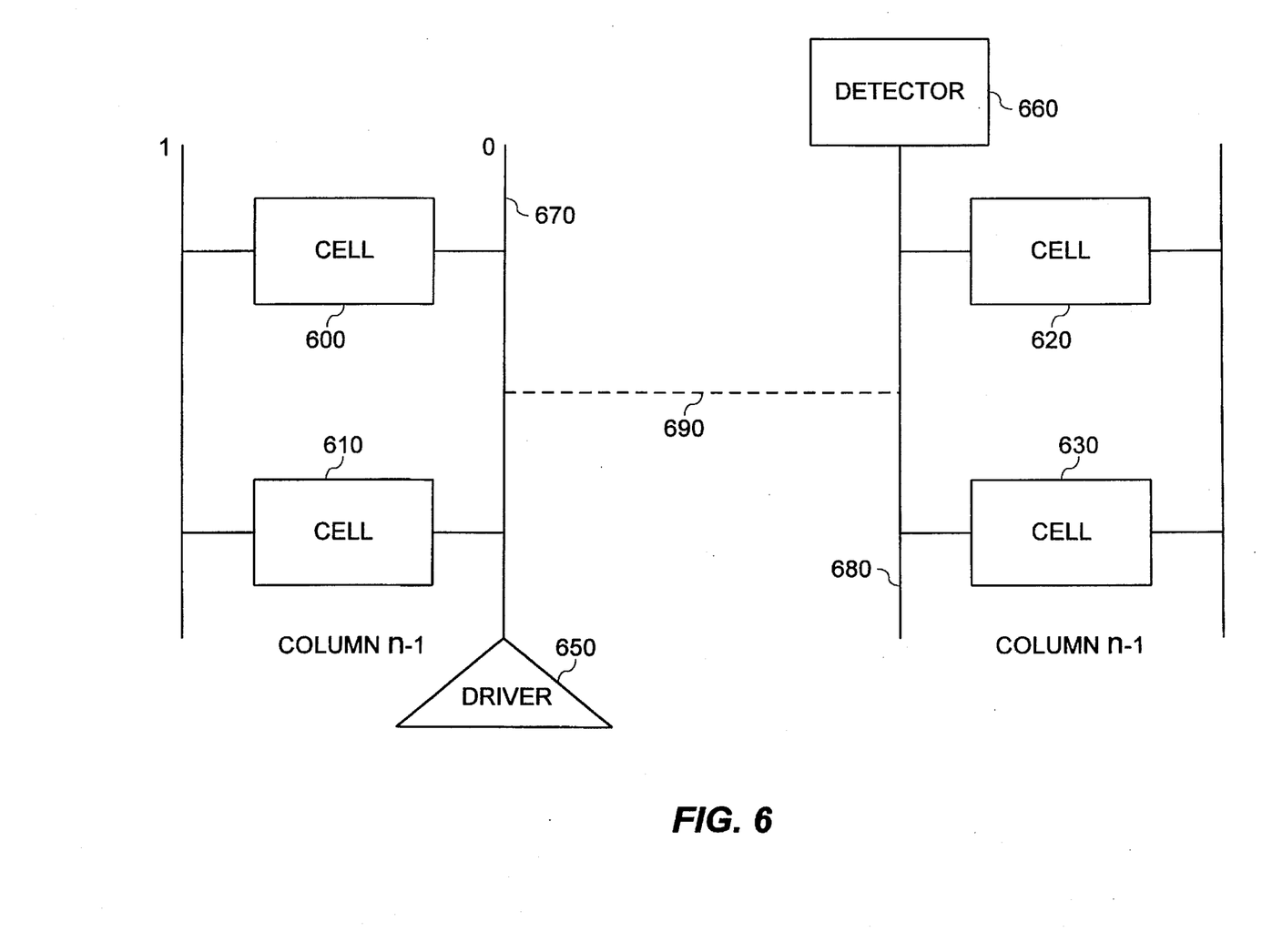
FIG. 6 is an illustration of the memory structure between the adjacent cell.

The column bridging faults force one column, and at the same time the adjacent columns are verified, as depicted in FIG. 6. A bridging fault occurs if there exists an unwanted electrical connection between the adjacent columns within the same I/O array 308 or between the I/O arrays. The column bridging test is carried out by first using a pull-up circuit to bring all of the column lines to a high value. After the pull-up circuit is disconnected, column cell 600 is driven to a low value while column cell 620 remains floating. Complimentary binary values are placed between the adjacent columns to test the bridging effects between the columns. If a bridging exists, the adjacent column will be pulled down through the Ohmic bridging connection between the two columns. The outputs of both columns are examined after allowing sufficient time for the pull-down to occur. This process is repeated for the next set of adjacent columns by bring all of the column lines to a high value by the pull-up circuit.

The row test 540 checks for faults for individual memory cells in memory array 160. The cells in memory array 160 are tested by writing a series of patterns to the cells and reading them back for comparison. Before the end of the row test, a retention test 550 is performed to detect any leakage of charge from the memory cells. The retention test verifies the data retention reliability of the memory cells by comparing the written pattern after a specified given amount of time to the original stored pattern. After the row faults in memory array 160 have been detected, row BISR 560 is enabled to repair the faulty lines in memory array 160.

Figure 7A:
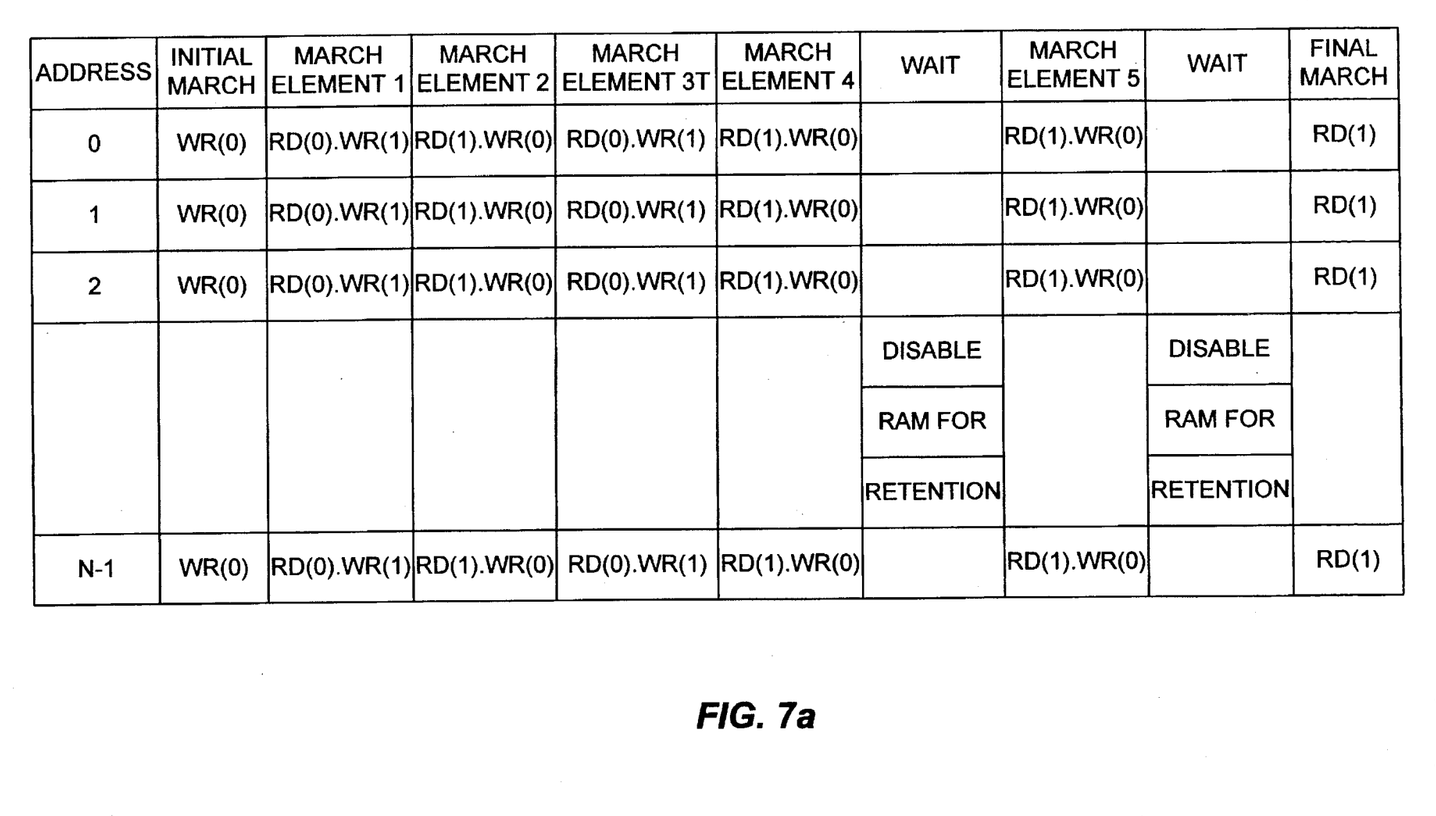
FIG. 7 is an illustration of the tables that contain the algorithms used for address redirection.
Figure 7B:
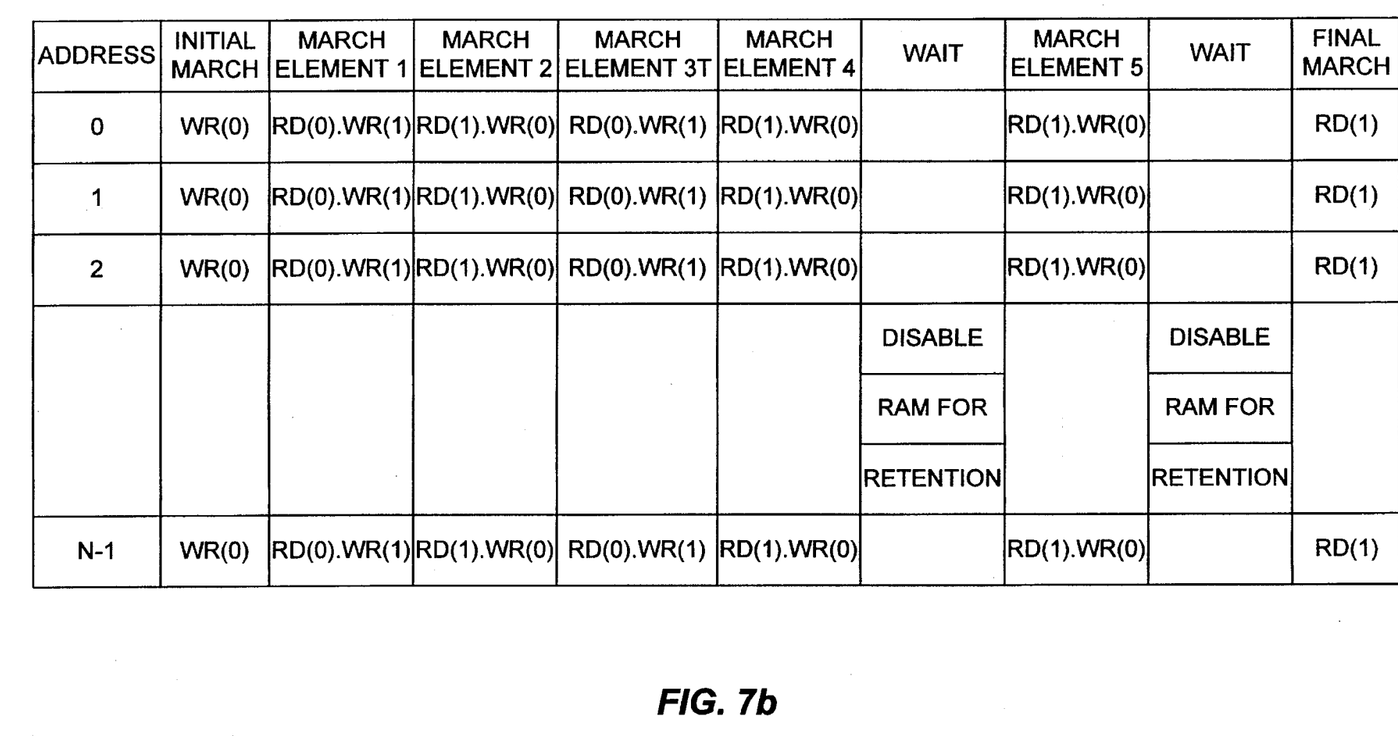

Referring now to FIGS. 7a and 7b illustrated are preferred algorithms for generating test patterns for row test to ensure that memory array 160 are functioning properly. Since the composition of memories are highly structured, the test pattern generated from test pattern generator 112 does not need to be excessively complex. These algorithms are on the order O(n), where n represents the number of cells in memory array 160. Among the O(n) algorithms, the 9N and 13N test algorithms have been shown to provide excellent breath of fault memory testing in a very efficient manner. The 9N algorithm is used in conjunction with standard SRAMs and the 13N algorithm is used specifically for memories equipped with latched outputs. These two algorithms begin with an initialization phase followed by a series of four marching patterns. FIG. 7a represents the 9N test algorithm for asynchronous memory where each march includes a reading of the previous value of the cell and then writing the opposite value to it. FIG. 7b illustrates the 13N test algorithm for synchronous memory such that each march includes a read, a write, and a read pattern, where two reads are required to ensure that any stuck open faults will be propagated through the circuit.

In addition to generating a test pattern to detect row faults, the capability for the memory cells to retain the accurate data is also tested. To detect a retention fault, a pattern is stored in the memory for a specified period of time before reading back for comparison. Any small leakage of currents within the cell will result in a reversal of the logic state for the stored value after a given time. Depending on the physical cause of the leakage current, the retention fault can occur for either a "0" or "1" logic value stored in the cell, which means both low and high logic states must be tested to detect retention faults in the memory cells. Given that the amount of leakage is dependent on the type of process, each memory design must be analyzed individually to determine that appropriate retention test time. Generally, the minimum required time for a memory retention test ranges from 50 to 100 ms. At the end of the retention time, the memory cell is read for comparison with the value of the stored pattern. This retention test is repeated twice, one to detect the high stored value and the other to detect the low stored value, with the memory cells being read after each test for comparison.

BIST 110 and BISR 120 are adaptable to different configurations of memory arrays. Although memory array 160 may be designed with any length on the x-axis and any length on the y-axis, it is preferable to configure the memory array area as close to a square configuration as possible, which means preferably the number of the column lines is as close to the number of row lines. Also, BIST 110 can be shared among different memories on the ASIC chip to test the validity of memory array 160 if the memory structures for those memories are similar in size and configuration. Unlike BIST circuitry that may be shared among memories with similar configurations, BISR requires individual fault signature and address correction blocks for each memory.

For an ASIC chip that contains more than one memory array, the memories are tested sequentially such that the test is run on one memory array before proceeding to the next memory array. For each memory array, the test procedure would be identical to the test for a single memory, including the column test, row test, and the data retention test. At the end of the retention test of the first memory, the next memory 570 is selected for testing. The test procedure repeats until all memory modules have been tested and repaired.

What is claimed is:

1. A method for on-chip testing and repairing configurable ASIC memories in a system that contains a test circuit, a repair circuit, a memory array, and a plurality of redundant lines within the memory array, the method comprising the steps of:

testing the memory array;

determining an original address of a line in the memory array that includes a fault; and repairing the faulty line with a redundant line by using the repair circuit to redirect the original address to an address of the redundant line.

2. The method according to claim 1, further comprising the step of:

prior to the repairing step, translating the original address to the redundant line address.

3. The method according to claim 2, further comprising the step of:

prior to the translating step, storing the original address.

4. The method according to claim 3, further comprising the step of:

prior to the storing step, transferring the original address from the test circuit to the repair circuit.

5. The method according to claim 1, wherein the redirecting step further comprises the steps of:

redirecting an original address of a faulty column to a redundant column line address; and redirecting an original address of a faulty row to a redundant row line address.

6. The method according to claim 2, wherein the translation step further comprises the steps of:

translating an original address of a faulty column to a redundant column line address; and translating an original address of a faulty row to a redundant row line address.

7. The method according to claim 3, wherein the storing step further comprises the steps of:

storing an original address for a faulty column; and storing an original address for a faulty row.

8. The method according to claim 4, wherein the transferring step further comprises the steps of:

transferring an original address of a faulty column to a redundant column line; and transferring an original address of a faulty row to a redundant row line.

9. The method according to claim 1, further comprising the steps of:

generating a first test pattern using a test pattern generator to detect a column fault in the memory array, including a stuck-at, a stuck-open, and a bridging fault; and generating a second test pattern using the test pattern generator to detect a row fault in the memory array, including a data retention fault within a memory cell.

10. The method according to claim 9, further comprising the steps of:

using the test circuit to detect an address of a column line in the memory array which includes a fault; and using the test circuit to detect an address of a row line in the memory array which includes a fault.

11. A process for on-chip testing and repairing configurable ASIC memories in a system that contains a test circuit, a repair circuit, a memory array, and a plurality of redundant lines within the memory array, the test circuit including a test pattern generator, the process comprising the steps of:

supplying a test pattern by the test pattern generator for testing a plurality of memory cells in the memory array;

detecting at least one fault in the memory array by the test circuit;

transferring the original address location of the at least one faulty line from the test circuit to the repair circuit;

storing an original address location of the at least one faulty memory line;

translating the original address location of the at least one faulty line to a mapped address location of at least one redundant line: and redirecting the original address location of the at least one faulty line to the mapped address location of the at least one redundant line.

12. The process according to claim 11 wherein the redirecting step further comprises the steps of:

redirecting the original address location of the at least one faulty column to the mapped address location of the at least one redundant column line by the repair circuit; and redirecting the original address location of the at least one faulty row to the mapped address location of the at least one redundant row line by the repair circuit.

13. An on-chip system for testing and repairing faulty ASIC memories comprising:

a memory array including a matrix of memory cells formed by intersecting a plurality of column lines with a plurality of row lines;

a redundant line, coupled to the memory array, for replacing faulty lines;

a testing circuit, coupled to the memory array, for testing the memory array and determining an original address of a line in the memory array that includes a fault; and a repair circuit, coupled to the memory array and the testing circuit, for repairing the faulty line with a redundant line by redirecting the original address to an address of the redundant line.

14. The system according to claim 13 wherein the repair circuit comprises:

a line fault signature circuit, for storing the original address of a line in the memory array that includes a fault; and, a line address correction circuit, for redirecting the original address to an address of the redundant line by reconfiguring the mapping of input addresses to the physical space of the memory array.

15. The system according to claim 13, further comprising:

a redundant column line, coupled to the memory array, for replacing faulty columns in the memory array; and, a redundant row line, coupled to the memory array, for replacing faulty rows in the memory array.

16. The system according to claim 15, wherein the repair circuit comprises:

a column self repair circuit, including a column fault signature circuit and a column address correction circuit, for storing the original address of a column in the memory array that includes a fault and for redirecting the original address to an address of a redundant column by reconfiguring the mapping of input addresses to the physical space of the memory array; and a row self repair circuit, including a row fault signature circuit and a row address correction circuit, for storing the original address of a row in the memory array that includes a fault and for redirecting the original address to an address of a redundant row by reconfiguring the mapping of input addresses to the physical space of the memory array.

17. The method of claim 1, wherein the repairing step comprises:

redirecting the original address to the address of the redundant line by using a line address correction circuit to reconfigure the mapping of input addresses to the physical space of the memory array.

* * * * *